United States Patent [19]

Takarada et al.

[11] Patent Number: 5,202,404
[45] Date of Patent: Apr. 13, 1993

[54] SILICONE BLOCK POLYMERS AND THEIR PREPARATION

[75] Inventors: Mitsuhiro Takarada; Kenichi Isobe, both of Annaka, Japan

[73] Assignee: Shin-Etsu Chemical Co., Ltd., Tokyo, Japan

[21] Appl. No.: 673,469

[22] Filed: Mar. 22, 1991

[30] Foreign Application Priority Data

Mar. 23, 1990 [JP] Japan .................... 2-73970

[51] Int. Cl.⁵ .................... C08G 77/04; C08G 77/42
[52] U.S. Cl. .................... 528/34; 528/14; 528/39
[58] Field of Search .................... 528/34, 14, 39; 106/287.16

[56] References Cited

U.S. PATENT DOCUMENTS

| | | | |
|---|---|---|---|
| 3,721,766 | 1/1988 | Inoue et al. | 528/18 |
| 4,296,228 | 10/1981 | Innertsberger et al. | 528/34 |
| 4,324,712 | 4/1982 | Vaughn, Jr. | 524/767 |
| 4,551,516 | 11/1985 | Kitamura et al. | 528/18 |
| 4,737,562 | 4/1988 | Chaudhury et al. | 528/34 |
| 4,772,675 | 9/1988 | Klosowski et al. | 528/34 |
| 4,973,644 | 11/1990 | Onishi et al. | 528/34 |

FOREIGN PATENT DOCUMENTS 56-125466 10/1981 Japan .
60-145815 8/1985 Japan .

*Primary Examiner*—John C. Bleutge
*Assistant Examiner*—Margaret W. Glass

[57] ABSTRACT

Silicone block polymers are obtained by cohydrolysis of a both end reactive diorganopolysiloxane and a silane or a partial hydrolyzate thereof or curing a both end reactive diorganopolysiloxane and an organopolysiloxane at room temperature or elevated temperatures. They have improved flexibility, stain resistance, thermal shock resistance, and water repellency and are suitable to form hard coatings, moistureproof coatings and topcoats.

7 Claims, No Drawings

SILICONE BLOCK POLYMERS AND THEIR PREPARATION

FIELD OF THE INVENTION

This invention relates to silicone block polymers and methods for preparing the same. More particularly, it relates to silicone block polymers which have improved properties including flexibility, stain resistance, thermal shock resistance, and water repellency and are thus suitable for use in plastic hard coating compositions, moisture-proof coating compositions for printed circuit boards, and exterior top-coating compositions.

BACKGROUND OF THE INVENTION

One prior art well-known process for preparing a silicone block polymer is by hydrolysis of a both end reactive diorganopolysiloxane of the following formula:

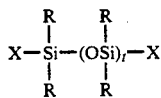

wherein R is an alkyl radical, X is a chlorine atom, hydroxyl radical or alkoxy radical, and t is an integer of at least 1 and a polyfunctional silane of the following formula:

$R_u SiX_{4-u}$ wherein R and X are as defined above and u is equal to 1 or 2. Undesirably, this process completes with a part of the both end reactive diorganopolysiloxane unreacted, and coatings of the cured polymer are susceptible to stain.

It is also known to subject the above-defined both end reactive diorganopolysiloxane and another silane to cohydrolysis in the presence of an acid catalyst. Due to cracking of the both end reactive diorganopolysiloxane, the resulting block polymers are sometimes less desirable and less improved in low-temperature resistance and flexibility. For example, Japanese Patent Application Kokai No. 125466/1981 proposes a coating composition comprising colloidal silica, $RSi(OH)_3$, and the both end reactive diorganopolysiloxane mentioned above, which is described as forming coatings having improved crack resistance. This composition, however, does not achieve a satisfactory improvement in crack resistance since the both end reactive diorganopolysiloxane is less reactive.

For the purpose of improving the water repellency, mold release, and lubricity of room temperature curable silicone resins, it is also known to add a diorganopolysiloxane of the following formula:

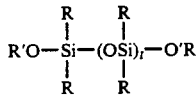

wherein R is as defined above and R' is an alkyl radical of the same type as R or different type from R. The resulting polymers are less curable, leaving the problems of stickiness and staining due to bleeding of unreacted oily diorganopolysiloxane.

Further, Japanese Patent Application Kokai No. 145815/1985 discloses a silazane base block polymer, which suffers from many problems. Since the polymer is prepared using ammonia, chlorosilane and organic solvent, there is formed an ammonium chloride by-product which has to be removed by filtration in a sealed environment. The silazane base block polymer needs careful handling because it is sensitive to moisture.

SUMMARY OF THE INVENTION

An object of the present invention is to provide a new and improved silicone block polymer having improved properties including flexibility, stain resistance, thermal shock resistance or crack resistance, and water repellency.

Another object of the invention is to provide a method for preparing such a silicone block polymer.

The inventors have found that these and other objects are achieved by preparing silicone block polymers from a diorganopolysiloxane of the general formula (1) which is reactive at both ends:

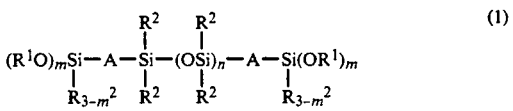

wherein $R^1$ is independently selected from the group consisting of a substituted or unsubstituted alkyl radical, acyl radical, alkoxyalkyl radical, and alkenyl radical, $R^2$ is independently selected from the group consisting of a substituted or unsubstituted alkyl radical, alkenyl radical, and aryl radical, A is an oxygen atom or an ethylene radical, m is equal to 2 or 3, and n is an integer of at least 1.

More particularly, silicone block polymers are obtained by cohydrolysis of a both end reactive diorganopolysiloxane of formula (1) and at least one silane of the general formula (2):

$$R^2_p Si(OR^1)_{4-p} \qquad (2)$$

wherein $R^1$ and $R^2$ are as defined above, and p is a positive number within the range: $0 \leq p \leq 3$, or a partial hydrolyzate thereof. The block polymers cure to coatings having improved properties including flexibility, stain resistance, thermal shock resistance, and water repellency.

Similarly, silicone block polymers are obtained by curing at room temperature or elevated temperatures of a both end reactive diorganopolysiloxane of formula (1) and an organopolysiloxane of the general formula (3):

$$(R^3O)_r R^2_q SiO_{(4-q-r)/2} \qquad (3)$$

wherein $R^2$ is as defined above, $R^3$ is independently selected from the group consisting of a hydrogen atom, an alkyl radical, acyl radical, alkoxyalkyl radical, and alkenyl radical, and q and r are positive numbers within the ranges: $0 \leq q \leq 1.8$, $0 < r \leq 3$, and $0 < q+r < 4$. These block polymers also cure to coatings having improved properties including flexibility, stain resistance, thermal shock resistance, and water repellency.

The both end reactive diorganopolysiloxane of formula (1) has two or more reactive groups at each end and is highly reactive to ensure that block polymers are formed even when such a linear reactant is used in large amounts. In contrast to the conventional polysiloxanes having only one functional group at each end, the diorganopolysiloxane of formula (1) eliminates the likelihood that it is left in the resin as an unreacted oily component. There are obtained cured coatings which exhibit excellent stain resistance, flexibility, and thermal shock resistance.

Conventional polysiloxanes having a chlorine atom or amino group at each end tend to be less curable in air because moisture converts the both ends into silanol form, and thus need careful handling in air. The both end reactive diorganopolysiloxane of formula (1) can maintain high reactivity in air and is thus easy to handle. The present invention is based on these findings.

Therefore, according to the present invention, there are provided a method for preparing a silicone block polymer comprising the step of effecting cohydrolysis between a both end reactive diorganopolysiloxane of formula (1) and a silane of formula (2) or a mixture thereof or a partial hydrolyzate thereof as well as the resulting silicone block polymer.

According to a second aspect of the present invention, there are provided a method for preparing a silicone block polymer comprising the step of curing a both end reactive diorganopolysiloxane of formula (1) and a organopolysiloxane of formula (3) at room temperature or elevated temperatures as well as the resulting silicone block polymer.

DESCRIPTION OF THE PREFERRED EMBODIMENTS

The methods for preparing silicone block polymers according to the present invention use a both end reactive diorganopolysiloxane which is represented by the following general formula:

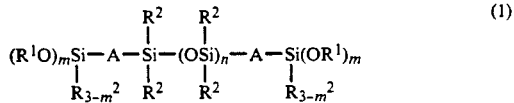

and has two or more reactive groups at each end.

In formula (1), $R^1$, which may be the same or different, is independently selected from the group consisting of a substituted or unsubstituted alkyl radical, acyl radical, alkoxyalkyl radical, and alkenyl radical. The alkyl radicals are preferably those having 1 to 4 carbon atoms, for example, methyl, ethyl, propyl, butyl, isopropyl, and isobutyl radicals. The acyl radicals are preferably those having 2 to 4 carbon atoms, for example, an acetyl radical. The alkoxyalkyl radicals are preferably those having 3 to 8 carbon atoms, for example, methoxyethyl, ethoxyethyl, butoxyethyl, methoxypropyl, and ethoxypropyl radicals. The alkenyl radicals are preferably those having 2 to 5 carbon atoms, for example, vinyl, isopropenyl, and allyl radicals.

$R^2$, which may be the same or different, is independently selected from the group consisting of a substituted or unsubstituted alkyl radical, alkenyl radical, and aryl radical. Preferably for $R^2$, the alkyl radicals have 1 to 6 carbon atoms, the alkenyl radicals have 2 to 6 carbon atoms, and the aryl radicals have 6 to 10 carbon atoms. Illustrative are methyl, ethyl, propyl, butyl, vinyl, allyl, phenyl, tolyl, 3,3,3-trifluoropropyl, and 3-chloropropyl radicals.

More preferably, $R^1$ is a methyl, ethyl or isopropenyl radical and $R^2$ is a methyl or phenyl radical. Where both methyl and phenyl radicals are contained as $R^2$, the polymer becomes more compatible with a silicone or other resins and provides coatings which are more heat resistant and easier to apply.

In formula (1), A is an oxygen atom or an ethylene radical. Letter m is equal to 2 or 3, preferably equal to 3 in view of reactivity, crosslinking and curing abilities. Diorganopolysiloxanes of formula (1) wherein m is equal to 1 are less reactive and fail to achieve the objects of the invention. Letter n is an integer of at least 1. Diorgano polysiloxanes of formula (1) wherein n is equal to 0 are less effective in providing polymers with flexibility, failing to achieve the objects of the invention. The value of n may be selected depending on the desired properties of the block polymer although n preferably ranges from 4 to 100 for providing flexibility and thermal shock resistance.

Some preferred, non-limiting examples of the diorgano polysiloxane of formula (1) are given below.

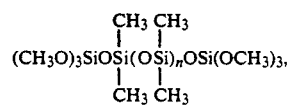

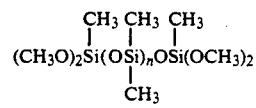

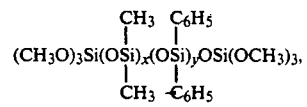

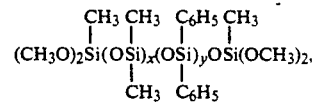

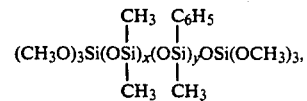

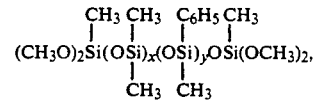

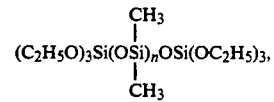

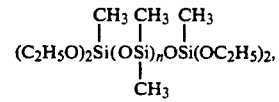

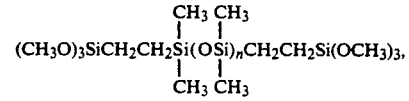

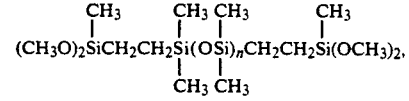

-continued (CH₃O)₃SiCH₂CH₂Si(OSi)ₓ(OSi)ᵧCH₂CH₂Si(OCH₃)₃, with CH₃/CH₃ on first OSi, CH₃/CH₃ on second OSi, C₆H₅/C₆H₅ side groups (CH₃O)₂SiCH₂CH₂Si(OSi)ₓ(OSi)ᵧCH₂CH₂Si(OCH₃)₃, with CH₃ on Si, CH₃/CH₃, CH₃/CH₃, C₆H₅/C₆H₅

(CH₃O)₃SiCH₂CH₂Si(OSi)ₓ(OSi)ᵧCH₂CH₂Si(OCH₃)₃, CH₃/CH₃, C₆H₅/C₆H₅, CH₃/CH₃

(CH₃O)₂SiCH₂CH₂Si(OSi)ₓ(OSi)ᵧCH₂CH₂Si(OCH₃)₂, CH₃ on each terminal Si, CH₃/CH₃, C₆H₅/C₆H₅, CH₃/CH₃

(C₂H₅O)₃SiCH₂CH₂Si(OSi)ₙCH₂CH₂Si(OC₂H₅)₃, CH₃/CH₃, CH₃/CH₃

(CH₂=CO)₂SiCH₂CH₂Si(OSi)ₙCH₂CH₂Si(OC(=CH₂))₂, CH₃/CH₃, CH₃/CH₃, CH₃/CH₃, CH₃/CH₃

(CH₂=CO)₂SiCH₂CH₂Si(OSi)ₓ(OSi)ᵧCH₂CH₂Si(OC(=CH₂))₂, CH₃/CH₃, CH₃/CH₃, C₆H₅/C₆H₅, CH₃/CH₃

In the formulae, x, y and n are integers of at least 1, preferably 4 to 100.

The both end reactive diorganopolysiloxanes of formula (1) may be prepared by conventional methods. For example, where A in formula (1) is an ethylene radical, they may be prepared simply by platinum catalyzed addition reaction between a both hydrogen terminated polysiloxane and a vinylalkoxysilane or by platinum catalyzed addition reaction between a both vinyl terminated polysiloxane and a hydrogen alkoxysilane. Where A in formula (1) is an oxygen atom, they may be prepared simply by dehydrogenation reaction between a both silanol terminated polysiloxane and a hydrogenalkoxysilane.

In the first aspect of the invention, silicone block polymers are prepared by cohydrolysis of a both end reactive diorganopolysiloxane of formula (1) as defined above and a silane of the general formula (2):

$$R^2_p Si(OR^1)_{4-p} \quad (2)$$

wherein $R^1$ and $R^2$ are as defined above and p is a positive number within the range: $0 \leq p \leq 3$ or a mixture thereof or a partial hydrolyzate thereof.

The preferred silanes of formula (2) are alkoxysilanes, alkenoxysilanes and acyloxysilanes, with the alkoxysilanes being widely used in commercial processes.

Some preferred, non-limiting examples of the silane of formula (2) are given below.

(CH₃O)₄Si, (C₂H₅O)₄Si, CH₃Si(OCH₃)₃, CH₃Si(OC₂H₅)₃,

CF₃CH₂CH₂Si(OCH₃)₃, CF₃CH₂CH₂Si(OC₂H₅)₃,

CF₃CH₂CH₂Si(OCH₃)₂ with CH₃, C₆H₅Si(OCH₃)₃, C₆H₅Si(OC₂H₅)₃, (CH₃)₂Si(OCH₃)₂, CH₂CHCH₂OC₃H₆Si(OCH₃)₃ (with epoxy), CH₂CHCH₂OC₃H₆SiCH₃(OC₂H₅)₂ (with epoxy),

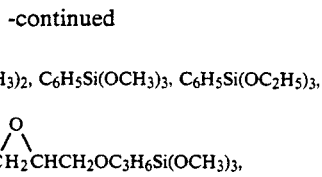C₂H₅Si(OCH₃)₃, (CH₃)₂Si(OC₂H₅)₂, (C₆H₅)₂Si(OCH₃)₂, (C₆H₅)₂Si(OC₂H₅)₂, (CH₃)(C₆H₅)Si(OCH₃)₂, (CH₃)(C₆H₅)Si(OC₂H₅)₂.

For the purpose of imparting wear resistance, inorganic fine particles such as methyl polysilicate, ethyl polysilicate, colloidal silica, colloidal alumina, colloidal titania, and colloidal antimony oxide may be added to the alkoxysilanes if necessary. The particles are usually added in amounts of 0 to 100 parts by weight per 100 parts by weight of the alkoxysilane.

Cohydrolysis of a both end reactive diorganopolysiloxane of formula (1) and a silane of formula (2) may be conducted by conventional procedures, for example, at a temperature of about 0 to about 65° C. for about ½ to about 24 hours in the presence of an acid catalyst such as hydrochloric acid, sulfuric acid, p-toluenesulfonic acid, methanesulfonic acid, and acetic acid, if necessary.

In the second aspect of the invention, silicone block polymers are prepared from a both end reactive diorganopolysiloxane of formula (1) as defined above and an organopolysiloxane of the general formula (3):

$$(R^3O)_r R^2_q SiO_{(4-q-r)/2} \quad (3)$$

through room temperature curing or heat curing. In formula (3), $R^2$ is as defined above, $R^3$ is independently selected from the group consisting of a hydrogen atom, an alkyl radical having 1 to 4 carbon atoms, an acyl radical having 2 to 4 carbon atoms, an alkoxyalkyl radical having 3 to 8 carbon atoms, and an alkenyl radical having 2 to 5 carbon atoms, and q and r are positive numbers within the ranges: $0 \leq q \leq 1.8$, $0 < r \leq 3$, and $0 < q + r < 4$, by curing them at room temperature or elevated temperatures.

The organopolysiloxanes of formula (3) include heat curable silicone resins and room temperature curable silicone resins.

In the process of room temperature curing or heat curing, a curing catalyst may be used for the purpose of increasing curing rate, if necessary. Examples of the curing catalyst used for heat curing include organic acids such as p-toluenesulfonic acid and methanesulfonic acid; organometallic compounds such as zinc octylate, cobalt octylate, iron octylate, dibutyltin dilaurate, sodium acetate, and potassium acetate; amines such as 3-aminopropyltriethoxysilane, N-(2-aminoethyl)-3-aminopropyltrimethoxysilane, tetramethylammonium hydroxide, trimethylbenzylammonium hydroxide, and diazabicycloundecene; and chelates of titanium, aluminum and similar metals. Examples of the curing catalyst used for room temperature curing include alkoxides and chelates of titanium, zirconium, aluminum and similar metals; titanium alkoxide homopolymers; amino-containing silane coupling agents; and organic tin compounds such as dibutyltin dioctoate and dibutyltin dilaurate. These curing catalysts may be used in effective amounts which are commonly used for conventional similar purposes and can be determined without undue experimentation.

The organopolysiloxanes of formula (3) are commercially available in catalyzed form, typically as commercial heat curable silicone resins and room temperature curable silicone resins. For example, the heat curable silicone resins are commercially available in the name of KR-311, KR-282, KR-255, and KR-155 (all trade names, manufactured by Shin-Etsu Chemical Co., Ltd.). The room temperature curable silicone resins are commercially available in the name of KR-112, X-40-175, X-40-2031, X-40-2032, and X-40-9740 (all trade names, manufactured by Shin-Etsu Chemical Co., Ltd.).

The reaction between a both end reactive diorganopolysiloxane of formula (1) and an organopolysiloxane of formula (3) to form silicone block polymers is not particularly limited and may proceed in conventional procedures, for example, at a temperature of 100 to 250° C. for about 5 minutes to about 12 hours in the case of heat curing type. In the room temperature curing type, the reactants will react and cure in the presence of moisture at room temperature within about 1 to about 7 days.

Preferably, the both end reactive diorganopolysiloxane of formula (1) is used in amounts of 0.5 to 200 parts by weight, more preferably 1 to 100 parts by weight per 100 parts by weight of the silane of formula (2) or organopolysiloxane of formula (3) calculated as the silicone resin solid component. Less than 0.5 parts of the diorganopolysiloxane would be insufficient to provide resins with flexibility and thermal shock resistance whereas more than 200 parts would yield polymers which are less curable and remain rather tacky.

Since the silicone block polymers of the invention have improved properties including flexibility, stain resistance, thermal shock resistance, and water repellency, they are suitable for use in coating compositions which find a wide variety of applications. For example, they are useful in formulating compositions for forming plastic hard coatings, protective coatings having low-temperature resistance and crack resistance, silicone exterior topcoats, protective coatings for electric and electronic boards requiring electrical insulation, moisture proofness, and stain resistance, and heat resistant coatings for kitchen appliances requiring stain resistance, heat resistance, and anti-stick quality. The methods of the invention insure the preparation of such improved silicone block polymers.

EXAMPLE

Examples of the present invention are given below by way of illustration and not by way of limitation. All parts are by weight.

EXAMPLE 1

With stirring, a mixture of 144 parts of toluene, 79.2 parts of phenyltrimethoxysilane, 60.8 parts of a both end reactive diorganopolysiloxane of formula (1-a):

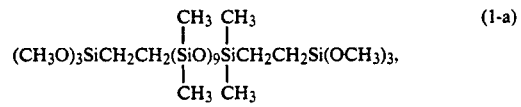

and 15.4 parts of 0.1N aqueous hydrochloric acid was maintained at 80° C. for 5 hours for hydrolysis to proceed, yielding a clear homogeneous resinous solution. An analysis of gel permeation chromatography (GPC) showed that the diorganopolysiloxane reactant had been entirely consumed.

A test piece was prepared by flow casting the resinous solution onto an iron strip of 0.3 mm thick and heat curing at 200° C. for 30 minutes.

COMPARATIVE EXAMPLE 1

With stirring, a mixture of 144 parts of toluene, 79.2 parts of phenyltrimethoxysilane, 45.5 parts of an organopolysiloxane of the following formula:

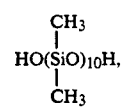

and 9.9 parts of 0.1N aqueous hydrochloric acid was maintained at 80° C. for 5 hours for hydrolysis to proceed. The resulting resinous solution was not homogeneous. A GPC analysis of the supernatant showed two peaks corresponding to the dimethylpolysiloxane reactant and a phenyltrimethoxysilane oligomer or a cohydrolyzate of phenyltrimethoxysilane and dimethylpolysiloxane.

As in Example 1, the resin solution was cast onto an iron strip of 0.3 mm thick and heated at 200° C. for 30 minutes. The coating cured to some extent, but remained too tacky to measure its physical properties.

EXAMPLE 2

A mixture of 328 grams of methyltrimethoxysilane, 92 grams of isobutyl alcohol, 17 grams of the both end reactive diorganopolysiloxane used in Example 1, and 290 grams of colloidal silica (Snowtex-O, manufactured by Nissan Chemical K.K.) was stirred at room temperature for 24 hours. A coating solution was prepared by adding 200 grams of ethanol, 300 grams of methyl ethyl ketone, and 0.3 grams of sodium acetate to the mixture.

A test piece was prepared by flow casting the coating solution onto an iron strip of 0.3 mm thick and heat curing at 120° C. for 60 minutes.

COMPARATIVE EXAMPLE 2

A test piece was prepared by the same procedure as in Example 2 except that the both end reactive diorganopolysiloxane was omitted.

EXAMPLE 3

A silicone composition was prepared by adding 2 grams of the both end reactive diorganopolysiloxane used in Example 1 to 100 grams of a room temperature curable silicone resin consisting of 98 grams of an organopolysiloxane of the following formula:

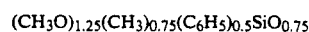

and 2 grams of a curing catalyst, TBT-700 (tetrabutyl titanate homopolymer, manufactured by Nihon Soda K.K.) and thoroughly mixing them.

A test piece was prepared by flow casting the composition onto an iron strip of 0.3 mm thick and allowing the coating to cure at room temperature for one week.

COMPARATIVE EXAMPLE 3

A test piece was prepared by flow casting only the room temperature curable silicone resin used in Example 3 onto an iron strip of 0.3 mm thick and allowing the coating to cure at room temperature for one week.

EXAMPLE 4

A silicone composition was prepared by adding 5 grams of a both end reactive diorganopolysiloxane of the following formula:

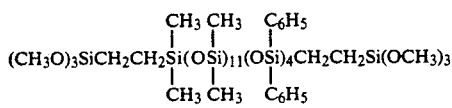

to 100 grams of the room temperature curable silicone resin used in Example 3 and thoroughly mixing them.

Using this composition, a test piece was prepared as in Example 3.

EXAMPLE 5

A silicone composition was prepared by adding 6 grams of the both end reactive diorganopolysiloxane used in Example 4 to 100 grams of a heat curable silicone resin consisting of 99.5 grams of a solution of an organopolysiloxane of the following formula:

$(CH_3)_{0.9}(C_6H_5)_{0.5}SiO_{1.18}(OH)_{0.24}$ in toluene (nonvolatile content 50%) and 0.5 grams of a zinc octylate curing catalyst, and thoroughly mixing them.

A test piece was prepared by flow casting the composition onto an iron strip of 0.3 mm thick and heat curing the coating at 200° C. for 30 minutes.

COMPARATIVE EXAMPLE 4

A test piece was prepared by flow casting only the heat curable silicone resin used in Example 5 onto an iron strip of 0.3 mm thick and heat curing the coating at 200° C. for 30 minutes.

The test pieces were measured for adhesion, flex resistance, thermal shock resistance, water repellency, and stain resistance by the following procedures. The results are shown in Table 1.

Adhesion

A cross hatch adhesion test was carried out according to JIS K-5400, Item 6-15, by scribing 11 cuts in a coating at a spacing of 1 mm in each of longitudinal and transverse directions with a knife edge, applying an adhesive tape (Cello-Tape ®, manufactured by Nichiban K.K.), and pulling off the tape. The number of the remaining sections per 100 sections was counted.

Flex Resistance

A mandrel test at a spacing of 2 mm was carried out according to JIS K-5400, Item 6-16. Samples with sound appearance passed while samples with anomalous appearance were rejected.

Thermal Shock Resistance

A test piece was subject to thermal cycling between +80° C. and −30° C. After 5 cycles, samples with sound appearance passed while cracked samples were rejected.

Water Repellency

A contact angle with water was measured.

Stain resistance

A test piece was exposed to weather for one month and then washed with water. Samples which were readily cleared of bio-slim passed while stained samples were rejected.

TABLE 1

|  | Examples |  |  |  |  | Comparative Examples |  |  |
| --- | --- | --- | --- | --- | --- | --- | --- | --- |
|  | 1 | 2 | 3 | 4 | 5 | 2 | 3 | 4 |
| Adhesion, /100 | 100 | 100 | 100 | 100 | 100 | 100 | 100 | 100 |
| Flex resistance | Pass | Pass | Pass | Pass | Pass | Rejected | Pass | Rejected |
| Thermal shock | Pass | Pass | Pass | Pass | Pass | Rejected | Rejected | Rejected |
| Contact angle | 110° | 113° | 92° | 89° | 95° | 96° | 86° | 82° |
| Stain resistance | Pass | Pass | Pass | Pass | Pass | Pass | Rejected | Rejected |

As seen from Table 1, the silicone block polymers of the invention are well resistant against bending, flexible, resistant against thermal shocks, water repellent, and stainproof.

Although some preferred embodiments have been described, many modifications and variations may be made thereto in the light of the above teachings. It is therefore to be understood that within the scope of the appended claims, the invention may be practiced otherwise than as specifically described.

We claim:

1. A silicone block polymer consisting essentially of the cohydrolysis reaction product of a both end reactive diorganopolysiloxane of general formula (1):

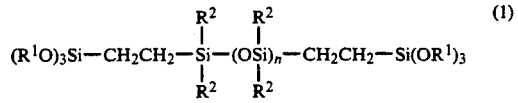

wherein $R^1$ is independently selected from the group consisting of a substituted or unsubstituted alkyl radical, acyl radical, alkoxyalkyl radical, and alkenyl radical, $R^2$ is independently selected from the group consisting of a substituted or unsubstituted alkyl radical, alkenyl radical, and aryl radical, and n is an integer of 1 to 100; and at least one silane of general formula (2), or a partial hydrolyzate thereof:

$$R_p^2 Si(OR^1)_{4-p} \qquad (2)$$

wherein $R^1$ and $R^2$ are as defined above, and p is a positive number within the range: $0 \leq p \leq 3$;

wherein 0.5 to 200 parts by weight of said diorganopolysiloxane of formula (1) is present in said copolymer per 100 parts by weight of said silane of formula (2).

2. The silicone block polymer of claim 1 wherein $R^1$ is a methyl, ethyl or isopropenyl radical and $R^2$ is a methyl or phenyl radical.

3. The silicone block polymer of claim 1 wherein the silane of formula (2) is selected from the group consisting of $(CH_3O)_4Si$, $(C_2H_5O)_4Si$, $CH_3Si(OCH_3)_3$, $CH_3Si(OC_2H_5)_3$, $CF_3CH_2CH_2Si(OCH_3)_3$, $CF_3CH_2CH_2Si(OC_2H_5)_3$,

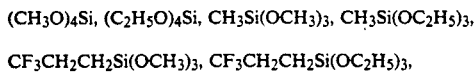

$CF_3CH_2CH_2Si(OCH_3)_2$, $C_6H_5Si(OCH_3)_3$, $C_6H_5Si(OC_2H_5)_3$,

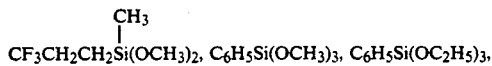

$(CH_3)_2Si(OCH_3)_2$, $CH_2CHCH_2OC_3H_6Si(OCH_3)_3$,

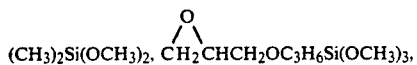

$CH_2CHCH_2OC_3H_6SiCH_3(OC_2H_5)_2$,

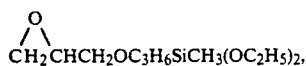

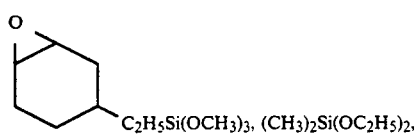

$C_2H_5Si(OCH_3)_3$, $(CH_3)_2Si(OC_2H_5)_2$, $(C_6H_5)_2Si(OCH_3)_2$, $(C_6H_5)_2Si(OC_2H_5)_2$, $(CH_3)(C_6H_5)Si(OCH_3)_2$, and $(CH_3)(C_6H_5)Si(OC_2H_5)_2$.

4. A method for preparing a silicone block polymer comprising the step of effecting cohydrolysis between a both end reactive diorganopolysiloxane of general formula (1):

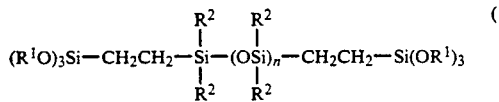

wherein
$R^1$ is independently selected from the group consisting of a substituted or unsubstituted alkyl radical, acyl radical, alkoxyalkyl radical, and alkenyl radical, $R^2$ is independently selected from the group consisting of a substituted or unsubstituted alkyl radical, alkenyl radical, and aryl radical, and n is an integer of 1 to 100; and at least one silane of general formula (2), or a partial hydrolyzate thereof:

wherein $R^1$ and $R^2$ are as defined above, and p is a positive number within the range: $0 \leq p \leq 3$, wherein 0.5 to 200 parts by weight of said diorganopolysiloxane of formula (1) is present in said copolymer per 100 parts by weight of said silane of formula (2).

5. The method of claim 4 wherein $R^1$ is a methyl, ethyl or isopropenyl radical and $R^2$ is a methyl or phenyl radical.

6. The method of claim 4 wherein the silane of formula (2) is selected from the group consisting of $(CH_3O)_4Si$, $(C_2H_5O)_4Si$, $CH_3Si(OCH_3)_3$, $CH_3Si(OC_2H_5)_3$, $CF_3CH_2CH_2Si(OCH_3)_3$, $CF_3CH_2CH_2Si(OC_2H_5)_3$,

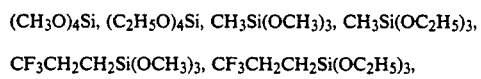

$(CH_3)_2Si(OCH_3)_2$, $CH_2CHCH_2OC_3H_6Si(OCH_3)_3$,

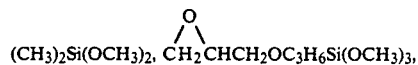

$CH_2CHCH_2OC_3H_6SiCH_3(OC_2H_5)_2$,

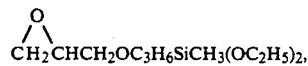

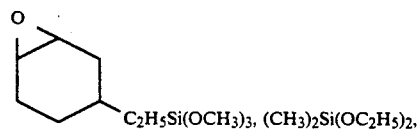

$C_2H_5Si(OCH_3)_3$, $(CH_3)_2Si(OC_2H_5)_2$, $(C_6H_5)_2Si(OCH_3)_2$, $(C_6H_5)_2Si(OC_2H_5)_2$, $(CH_3)(C_6H_5)Si(OCH_3)_2$, and $(CH_3)(C_6H_5)Si(OC_2H_5)_2$.

7. The method of claim 4 wherein cohydrolysis is effected at a temperature of 0 to 65° C. in the presence of an acid catalyst.

* * * * *